United States Patent [19]
Kato et al.

[11] Patent Number: 5,879,979
[45] Date of Patent: Mar. 9, 1999

[54] METHOD OF MANUFACTURING A SEMICONDUCTOR DEVICE CONTAINING CMOS ELEMENTS

[75] Inventors: Juri Kato; Kazuo Tanaka, both of Suwa, Japan

[73] Assignee: Seiko Epson Corporation, Tokyo, Japan

[21] Appl. No.: 412,939

[22] Filed: Mar. 29, 1995

Related U.S. Application Data

[62] Division of Ser. No. 99,592, Jul. 30, 1993, abandoned.

[30] Foreign Application Priority Data

| Jul. 31, 1992 | [JP] | Japan | 4-205203 |
| Jul. 31, 1992 | [JP] | Japan | 4-205204 |
| Feb. 23, 1993 | [JP] | Japan | 5-33645 |
| Jun. 24, 1993 | [JP] | Japan | 5-180852 |

[51] Int. Cl.⁶ .................................................. H01L 21/8238
[52] U.S. Cl. ........................ 438/218; 435/227; 435/232
[58] Field of Search .............................. 437/34, 57, 56, 437/58, 59; 438/199–233

[56] References Cited

U.S. PATENT DOCUMENTS

| 3,919,008 | 11/1975 | Iwamatsu | 438/220 |
| 4,382,827 | 5/1983 | Romano-Moran et al. | 437/34 |
| 4,445,270 | 5/1984 | Hsu | 438/233 |
| 4,574,467 | 3/1986 | Halfacre et al. | 437/57 |
| 4,812,829 | 3/1989 | Kakumu . | |
| 4,812,889 | 3/1989 | Kakumu | 257/755 |
| 5,036,019 | 7/1991 | Yamane et al. | 438/321 |
| 5,130,266 | 7/1992 | Huang et al. | 438/231 |
| 5,190,888 | 3/1993 | Schwalke et al. | 437/57 |
| 5,218,232 | 6/1993 | Yuaurihara et al. | 257/754 |
| 5,268,323 | 12/1993 | Fischer et al. | 437/57 |
| 5,290,713 | 3/1994 | Matsumoto | 438/516 |
| 5,304,502 | 4/1994 | Hanagasaki | 437/57 |

OTHER PUBLICATIONS

Kato et al, "Gate Oxide Degradation By Anomalous Oxidation of Mosi₂ on Polycrystalline Silicon Implanted with High Doses of Dopants," Oral Presentation—Dec. 11, 1992.

*Primary Examiner*—Brian Dutton
*Attorney, Agent, or Firm*—Oliff & Berridge, PLC

[57] ABSTRACT

In a CMOS-element-containing semiconductor device, the CMOS element comprises: a silicon substrate; an n-channel MOS element formed on the silicon substrate and including an n-type source/drain region, a gate oxide film and a gate electrode; a p-channel MOS element formed on the silicon substrate and including a p-type source/drain region, a gate oxide film and a gate electrode; and a gate wiring layer electrically interconnecting the gate electrode of the n-channel MOS element and the gate electrode of the p-channel MOS element with one another. At least one of the p-channel MOS element gate electrode, the n-channel MOS element gate electrode and the gate wiring layer include at least in part a metal silicide layer. The gate electrodes and the gate wiring layer contain impurities consisting of at least one of a III group dopant and a V group dopant in total concentration of at most $3\times10^{20}$ atoms $cm^{-3}$.

6 Claims, 15 Drawing Sheets

FIG. 1
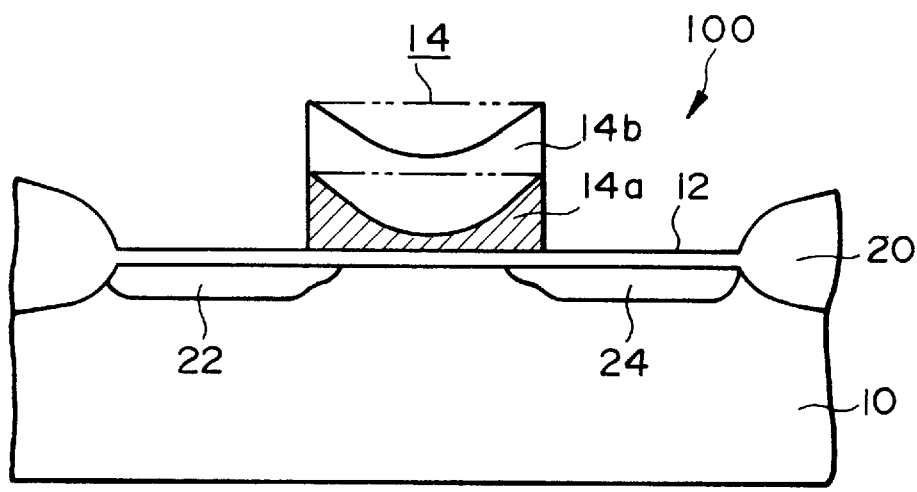
FIG. 2A
FIG. 2B
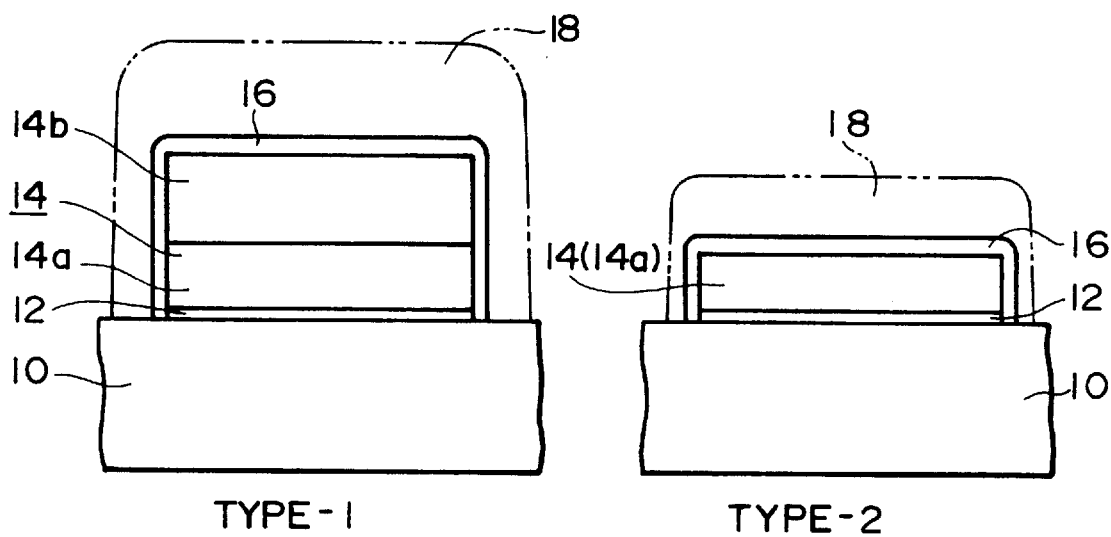
TYPE-1
TYPE-2

FIG. 23

| LOT NO. | COMPARATIVE EXAMPLE | | | | EXAMPLE | | |
|---|---|---|---|---|---|---|---|
| | 01 | 02 | 03 | 04 | 05 | 06 | 07 |
| YIELD CHANGE (%) | 0 (REFERENCE) | -8 | -7 | +2.5 | +10 | +10 | +11 | ns
METHOD OF MANUFACTURING A SEMICONDUCTOR DEVICE CONTAINING CMOS ELEMENTS

This is a Division of application No. 08/099,592 filed Jul. 30, 1993, now abandoned.

BACKGROUND OF THE INVENTION

1. Field of the Invention

This invention relates to a semiconductor device containing a complementary MOS (CMOS) element and a method of manufacturing the semiconductor device.

2. Description of the Related Art

Conventionally, a known gate electrode of MOS element is a polycide gate electrode in a laminated structure composed of at least two layers, i.e. a polysilicon layer and a refractory metal silicide layer. In order to meet with much higher integration of IC elements in recent years, attempts have been made to reduce MOS element electrodes in thickness. For example, in a device structure according to 0.5 μm rule, it is required that gate electrodes should have a thickness of less than about 3000 angstrom.

The present inventors have observed that the thickness of the gate electrodes, a polysilicon layer in particular, was inadvertently reduced due to heat treatment in the semiconductor device manufacturing process after formation of gate electrodes. This reduction of thickness of the polysilicon layer increases the stress on the gate oxide film or causes the metal of the silicide layer to penetrate into the gate oxide film, thus breaking the gate oxide film or deteriorating its characteristics.

SUMMARY OF THE INVENTION

It is therefore an object of this invention to provide a highly reliable CMOS-element-containing semiconductor device in which the reduction of the thickness of the gate electrode films has been avoided, gate oxide films are free from being deteriorated and/or destroyed, and to provide a method of manufacturing such a semiconductor device.

According to the present invention, there is provided a semiconductor device containing a CMOS element, wherein said CMOS element comprises:

(a) a silicon substrate;

(b) an n-channel MOS element formed on said silicon substrate and including an n-type source/drain region, a gate oxide film and a gate electrode;

(c) a p-channel MOS element formed on said silicon substrate and including a p-type source/drain region, a gate oxide film and a gate electrode;

(d) a gate wiring layer electrically interconnecting said gate electrode of said n-channel MOS element and said gate electrode of said p-channel MOS element with one another; and (e) at least one of said gate electrodes and said gate wiring layer including at least in part a metal silicide layer, said p-channel MOS element gate electrode, said n-channel MOS element gate electrode and said gate wiring layer containing impurities of at least one of a III group dopant and a V group dopant in a total concentration of at most $3\times10^{20}$ atoms $cm^{-3}$.

According to the present invention, there is provided a first method of manufacturing a semiconductor device, comprising the steps of:

(a) forming an element isolation region on a silicon substrate and then forming a gate oxide film for an n-channel MOS element and a p-channel MOS element;

(b) forming gate electrodes and a gate wiring layer electrically interconnecting said gate electrodes, including at least a metal silicide layer;

(c) forming a source/drain region by forming a resist mask, which has an opening only in an active region of a first MOS element and covers an active region and an element isolation region of a second MOS element, and then by doping impurities, which correspond to the polarity of said first MOS element, via said opening; and (d) forming a source/drain region, upon removal of said resist mask, by forming a resist mask, which has an opening only in said active region of said second MOS element and covers said active region and said element isolation region of said first MOS element, and then by doping impurities, which correspond to the polarity of said second MOS element, via the second-named opening.

According to the present invention, there is provided a second method of manufacturing a semiconductor device, comprising the steps of:

(a) forming an element isolation region on a silicon substrate and then forming a gate oxide film for an n-channel MOS element and a p-channel MOS element;

(b) forming gate electrodes and a gate wiring layer, including at least a metal silicide layer;

(c) forming an insulating film as a surface layer of at least one of said p-channel MOS element gate electrode, said n-channel MOS element gate electrode and said gate wiring layer, said insulating film having a thickness larger than the distance of movement of impurity ions to be doped while forming said source/drain region; and (d) forming a source/drain region by doping p-type impurities into a p-channel MOS region or by doping n-type impurities into an n-channel MOS region. respectively.

According to the present invention, there is provided a third method of manufacturing a semiconductor device, comprising the steps of:

(a) forming an element isolation region on a silicon substrate and then forming a gate oxide film for an n-channel MOS element and a p-channel MOS element;

(b) forming gate electrodes and a gate wiring layer electrically interconnecting said gate electrodes, including at least a metal silicide layer;

(c) forming a source/drain region by forming a resist mask having an opening in a first MOS element region and then by doping impurities, which correspond to the polarity of said first MOS element, via said opening;

(d) forming a source/drain region, upon removal of said resist mask, by forming a resist mask having an opening in a second MOS element region and then by doping impurities, which correspond to the polarity of said second MOS element, via said opening; and (e) said resist mask formed in the step (d) overlapping, at a border region between said n-channel MOS element and said p-channel MOS element, by at least 1 μm said resist mask formed in the step (c).

FIG. 1 is a diagram showing the manner in which the thickness of a gate electrode layers in a p-channel MOSFET 100 is reduced. In the p-channel MOSFET 100, an element isolation region 20 and a gate oxide film 12 are formed on a surface of an n-type silicon (Si) substrate 10. On a surface of the gate oxide film 12, a gate electrode 14 is formed and has a double-layer structure composed of lower and upper layers, i.e. a polysilicon layer 14a and a metal silicide layer 14b. In the Si substrate 10, source/drain regions 22, 24 are formed on opposite sides of the gate electrode 14. The term "source/drain region" means the source region or the drain region: if one region is a source region, the other region is a drain region.

The present inventors observed the following phenomenon with such MOSFET. Namely, when the gate electrode 14 was formed, the gate electrode 14 assumed a polycide structure having a generally uniform thickness as indicated by double-dot-and-dash lines in FIG. 1. After it was treated by high temperature oxidation at a temperature of, for example, at least 800° C., the polysilicon layer 14a was consumed remarkably so as to have a reduced thickness particularly at its central portion. This reduction in thickness of the polysilicon layer 14a deteriorated the gate oxide film 12 in gate breakdown characteristic; in the worst case, the gate oxide film 12 was destroyed as the metal of the metal silicide layer penetrated into the gate oxide film. The smaller the thickness of the gate electrode 14, the more serious this problem became.

The present inventors conducted various tests in order to find any cause for reduction of thickness of the polysilicon layer 14a constituting the gate electrode 14 and found the following results as one of causes that seemed to have given a particularly great influence. The testing method and test results were as follows:

(1) Testing Method

As two kinds of samples, a polycide gate electrode (Type-1) in a double-layer structure composed of a polysilicon layer 14a and a metal silicide layer 14b as gate electrodes, and a gate electrode (Type-2) in a single-layer structure having only a polysilicon layer were formed. Every sample, for which a different kind of dopant was used, was treated by oxidation. The thickness of a resulting oxide film was measured for every sample.

The sample forming method, the kinds of dopant and method of the oxidation treatment were as follows.

Preparation of Samples

FIG. 2A shows the polycide gate electrode (Type-1), and FIG. 2B shows the gate electrode (Type-2) in a single-layer structure having only a polysilicon layer. These gate electrodes 14 were formed according to the flow diagram of FIG. 4.

In the preparation of the gate electrode of Type-1, a gate oxide film 12 having a thickness of about 150 angstrom was formed on an n-type Si substrate 10 by wet oxidation. On the gate oxide film 12, a polysilicon layer 14a having a thickness of about 1500 angstrom was formed by low pressure chemical vapor deposition (LPCVD). Phosphorus was doped into the polysilicon layer 14a at a temperature of 850° C. using POCL3 source.

Then on the surface of the polysilicon layer 14a, a molybdenum silicide ($MoSi_{2.3}$) layer 14b having a thickness of 1500 angstrom was formed by DC magnetron sputtering in argon atmosphere at a temperature of about 60° C. at a pressure of $4 \times 10^{-3}$ Torr. Further, a thermal oxide film 16 having a thickness of 30 nm was formed by dry oxidation at 900° C. for 30 minutes and by annealing in nitrogen atmosphere at 1000° C. for 30 minutes. This thermal oxide film 16 was removed by dry etching to expose the molybdenum silicide surface. This dry etching took place under the following conditions: 1000 (SCCM) of CHF3, 65 (SCCM) of $C_2F_6$, pressure of 200 (mTorr), power of 550 (W), and etching time of 30 seconds. Subsequently, an oxide silicon layer (oxide cap) was deposited to a thickness of 15 nm. For this deposition, oxidation treatment took place for 23 minutes in $N_2O+CH_4$ gas at a temperature of 780° C. and a pressure of 200 Pa. By the foregoing process, the gate electrode 14 of Type-1 was prepared.

The gate electrode 14 of Type-2 also was prepared in the same process as for the gate electrode 14 of Type-1, except that no molybdenum silicide layer 14b was formed.

Implantation of Dopant

For the individual samples, some kinds of dopants were implanted into the respective gate electrodes 14 by ion implantation. The kinds of dopants, the quantity of implantation and the implantation energy were as follows:

(a) No dopant
(b) As, $6 \times 10^{15}$ cm$^{-2}$, 50 keV
(c) $BF_2$, $4 \times 10^{15}$ cm$^{-2}$, 60 keV
(d) $BF_2$, $4 \times 10^{15}$ cm$^{-2}$, 60 keV
  As, $6 \times 10^{15}$ cm$^{-2}$, 50 keV High Temperature Oxidation Treatment Then, annealing took place at 900° C. for 20 minutes, whereupon wet oxidation took place at 830° C. for 40 minutes. By this high temperature oxidation, oxide films 18 were formed as indicated by double-dot-and-dash lines in FIGS. 2A and 2B. The thickness of each of these oxide films 18 was measured by a transmission electron microscope (TEM). The results of measurement are shown in FIG. 3.

Results of Test

Following is apparent from FIG. 3, in which the X coordinate represents the kind of the dopant and the Y coordinate represents the thickness of the oxide film 18.

In the case of either the Type-1 gate electrode of polycide or the Type-2 gate electrode in a single layer of polysilicon, it was found that the sample with dopant implanted was larger in thickness of the oxide film 18 than the sample without dopant implanted.

In the Type-1 samples, the individual oxide film 18 has a different thickness depending on the kind of dopant. Specifically, the thickness of the oxide film 18 when the dopant was only As is smaller than that when the dopant was only $BF_2$. This oxide film thickness when As and $BF_2$ coexisted is larger than that in either case when As or $BF_2$ existed solely. Whereas in the Type-2 samples, it was found that the thickness of the oxide film 18 was not so dependent on the kind of impurities.

Thus it turned out that in the polycide electrode containing metal silicide, the oxide film became remarkably thicker due to abnormal oxidation, compared to the electrode layer in a single layer of polysilicon, and that remarkably abnormal oxidation also occurred when the III group dopant ($BF_2$) and the V group dopant (As) coexisted.

Presumably such abnormal oxidation occurred by the following mechanism. The solid solubility of dopant impurities in the gate electrode 14, more particularly in the metal silicide layer 14b and $SiO_2$ film layer formed by oxidation is less than 1. Therefore these dopants diffused into the $SiO_2$ film 18 formed by oxidation. Since the oxidizing species (O, OH) in the $SiO_2$ film with these dopants diffused have a large diffusion constant, it accelerated forming the oxide film 18. Further, because of its very large diffusion constant, fluorine could move to the oxide film 18 with ease so that oxidation was facilitated also by fluorine.

With accelerated oxidation, since the quantity of silicon in the molybdenum silicide layer is less than a stoichiometric value, Si in the polysilicon layer 14a or the lower layer moved to the silicide electrode 14b or the upper layer, and as a result, the polysilicon layer 14a was consumed to become smaller in thickness.

This invention has been made based on the foregoing discovery and knowledge. According to this invention, in a conductive layer such as a gate electrode or a gate wiring layer, containing a metal silicide layer, the total concentration of impurities consisting of at least one of a III group dopant and a V group dopant is at most $3 \times 10^{20}$ atoms $cm^{-3}$, preferably, the total concentration of the same impurities in the metal silicide layer is at most $1 \times 10^{18}$ atoms $cm^{-3}$, and, more preferably, at most $1 \times 10^{16}$ atoms $cm^{-3}$ so that abnormal accelerated oxidation can be prevented to reduce the consumption of the polysilicon layer.

The V group dopant may be at least one selected from the group consisting of arsenic, phosphorus and antimony. The III group dopant may be at least one selected from the group consisting of boron and halogenated boron such as boron fluoride. Since abnormal oxidation would tend to occur particularly when III group and V group dopants coexist, the concentration of III group dopant in a conductive layer region is at most $1.9 \times 10^{20}$ atoms $cm^{-3}$, more preferably at most $1 \times 10^{19}$ atoms $cm^{-3}$, and the concentration of V group dopant is preferably at most $2.9 \times 10^{20}$ atoms $cm^{-3}$, more preferably at most $2 \times 10^{20}$ atoms $cm^{-3}$.

Further since in the case of $BF_2$, accelerated oxidation would tend to occur in the gate electrode of p-channel MOS element, the concentration of B in a conductive layer region is preferably at most $3.3 \times 10^{19}$ atoms $cm^{-3}$, more preferably at most $1 \times 10^{19}$ atoms $cm^{-3}$ and much more preferably at most $1 \times 10^{18}$ atoms $cm^{-3}$.

It is preferable that dopants, introduced into the source/drain region would not be implanted into the gate electrode and particularly not into the metal silicide layer.

According to this invention, it is possible to provide a highly reliable CMOS-element-containing semiconductor device in which as reduction of thickness of gate electrode films has been avoided, gate oxide films are free from being deteriorated and/or destroyed, and also to provide a method of manufacturing such semiconductor device.

BRIEF DESCRIPTION OF THE DRAWINGS

FIG. 1 is a diagram showing the manner in which a gate electrode has been reduced in thickness due to abnormal oxidation;

FIG. 2A is a diagram showing a polycide gate electrode in a double-layer structure;

FIG. 2B is a diagram showing a gate electrode in a single-layer structure having only a polysilicon layer;

FIG. 23 is a table showing the results of lot quality tests conducted in connection with 1M bit SRAMs each containing CMOSFET formed according to the first embodiment of the invention.

DETAILED DESCRIPTION OF THE PREFERRED EMBODIMENTS

First Embodiment

Figure 3:
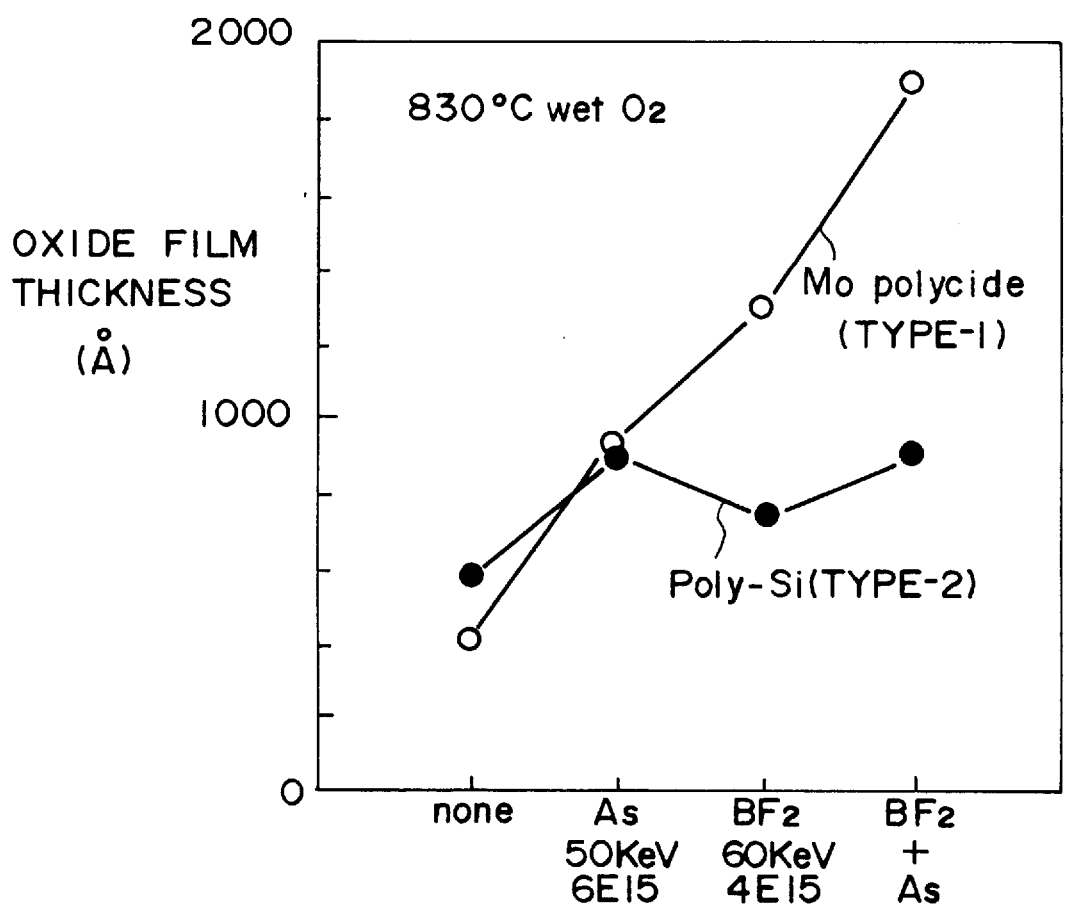
FIG. 3 is a graph showing the relationship between the kind of dopant implanted in the gate electrode and the thickness of the oxide film after high temperature oxidation treatment, the X coordinate representing the kind of dopant and the Y coordinate representing the thickness of the oxide film.
Figure 4:
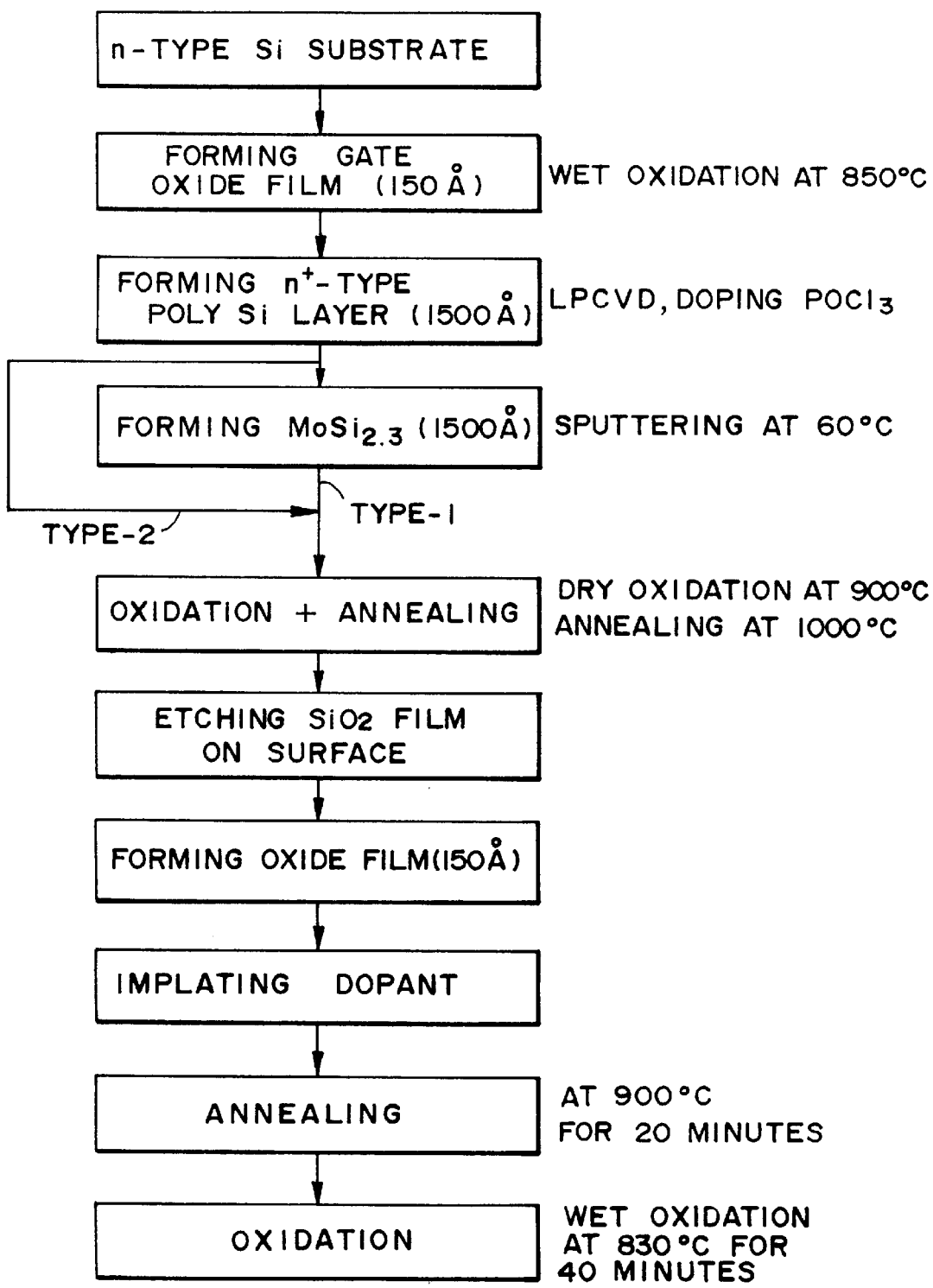
FIG. 4 is a flow diagram showing a manufacturing process for the gate electrodes of FIGS. 2A and 2B.
Figure 5:
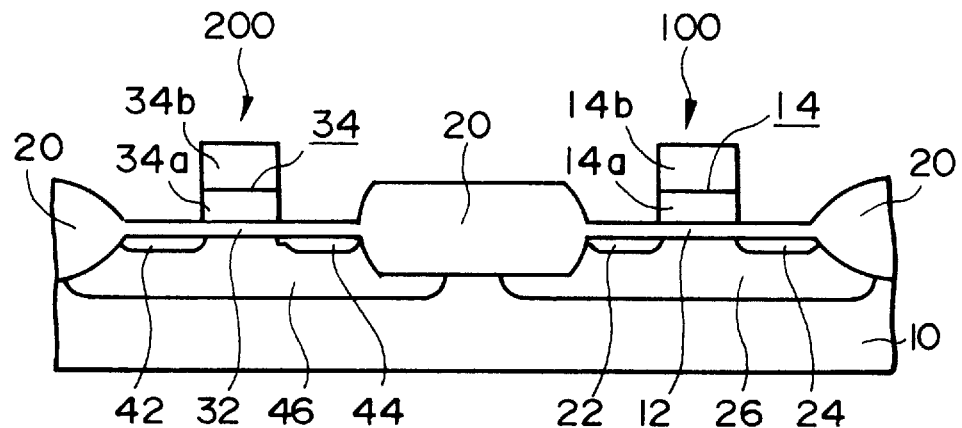
FIG. 5 is a schematic cross-sectional view showing the principal part of CMOSFET according to a first embodiment of this invention.
Figure 6:
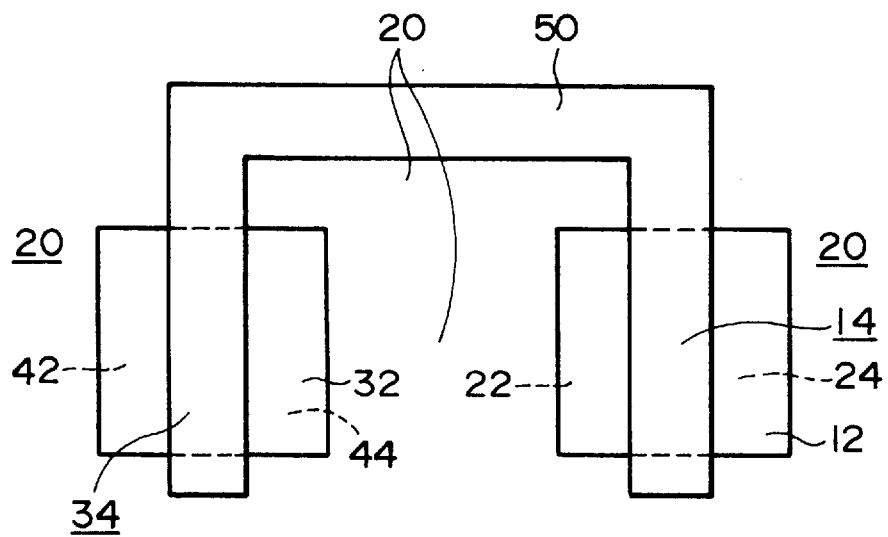
FIG. 6 is a schematic plan view of the CMOSFET of FIG. 5.

FIGS. 5 and 6 show the principal part of a CMOSFET according to a first embodiment of this invention; FIG. 5 is a schematic cross-sectional view showing the CMOSFET, and FIG. 6 is a schematic plan view showing the CMOSFET.

In the CMOSFET, a p-channel MOSFET (hereinafter called "pMOSFET") 100 and an n-channel MOSFET (nMOSFET) 200 are formed on an n-type silicon (Si) substrate 10 via an element isolation region 20. The pMOSFET 100 includes an n-type well 26 formed in the Si substrate 10, a gate oxide film 12, a gate electrode 14 and source/drain regions 22 and 24. The nMOSFET 200 includes a p-type well 46 formed in the Si substrate 10, a gate oxide film 32, a gate electrode 34, and source/drain regions 42 and 44. The gate electrode 14 and the gate electrode 34 are electrically connected to each other by a gate wiring layer 50 having the same polycide structure as these gate electrodes.

The gate electrode 14 has a polycide structure composed of a polysilicon layer 14a and a metal silicide layer 14b in laminate. In the gate electrode 14, B or $BF_2$ as a III group dopant is implanted in a concentration of $(0.9 \text{ to } 1.9) \times 10^{20}$ atoms $cm^{-3}$, and As or P as a V group dopant is implanted in a concentration of $(0.9 \text{ to } 2.9) \times 10^{20}$ atoms $cm^{-3}$.

The gate electrode 34, like the gate electrode 14, has a polycide structure composed of a polysilicon layer 34a and a metal silicide layer 34b in laminate. In the gate electrode 34, there scarcely exists B or $BF_2$ as the III group dopant, namely, B or $BF_2$ exists in a concentration of at most $1 \times 10^{19}$ atoms $cm^{-3}$. There also exists As or P as the V group dopant in a concentration of $(0.9 \text{ to } 2.9) \times 10^{20}$ atoms $cm^{-3}$.

Further, in the gate wiring layer 50, there substantially do not coexist a III group dopant and a V group dopant. Specifically, there scarcely exists B or $BF_2$ as the III group dopant, namely, B or $BF_2$ exists in a concentration of at most $1 \times 10^{19}$ atoms $cm^{-3}$. There also exists As or P as the V group dopant in a concentration of $(0.9 \text{ to } 2.9) \times 10^{20}$ atoms $cm^{-3}$.

It is preferable that the individual gate electrodes 14 and 34 each contains excessive silicon in their respective metal silicide, layers 14b and 34b beyond the theoretical chemical quantitative ratio. For example, if molybdenum silicide or tungsten silicide is used as metal silicide, x of $MoSi_x$ is preferably in a range of 2.1 to 2.7 and x of $WSi_x$ is preferably in a range of 2.1 to 2.7.

The manufacturing process for the CMOSFET of this embodiment will now be described with reference to FIGS. 7 through 14.

Figure 7:
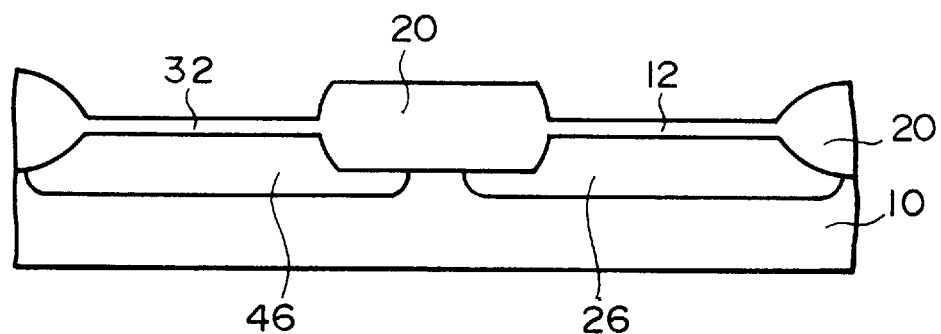
FIG. 7 is a schematic cross-sectional view showing the state in which a gate oxide film and an element isolation region have been formed, illustrating one step of the manufacturing process for CMOSFET of FIG. 5.

(A) As shown in FIG. 7, an n-type well 26 and a p-type well 46 are formed in the n-type silicon substrate 10 by the ordinary method, and then an element isolation region 20 is formed by LOCOS technology, whereupon gate oxide films 12 and 32 are formed by the ordinary method.

Figure 8:
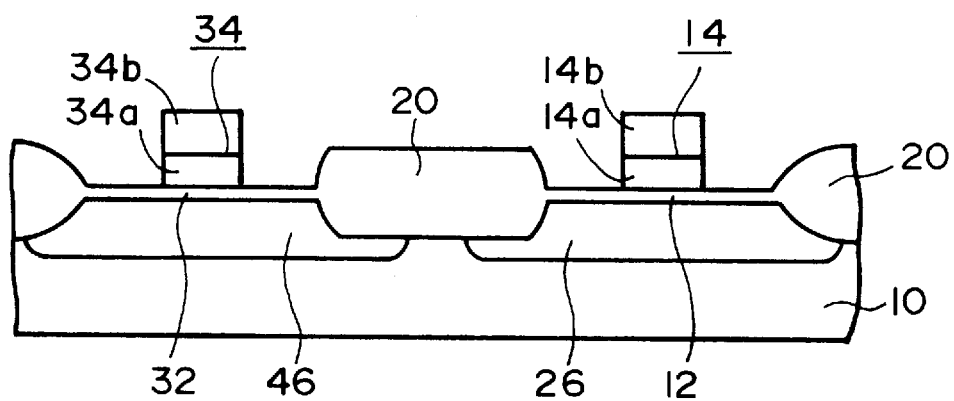
FIG. 8 is a schematic cross-sectional view showing the state in which the gate electrode has been formed, illustrating one step of the manufacturing process for the CMOSFET of FIG. 5.

(B) Then, as shown in FIG. 8, gate electrodes 14 and 34 are formed. Firstly, a polysilicon layer is formed in a thickness of 1000 to 4000 angstrom by CVD, for example, in $SiH_4+O_2$ atmosphere at a temperature of 630° C. and a pressure of 40 Pa. In the polysilicon layers 14a and 34a, (Phosphorous) is doped in a concentration of $(0.9 \text{ to } 4.9) \times 10^{20}$ atoms $cm^{-3}$. Further, the molybdenum silicide layers 15b and 34b are deposited in a thickness of 1000 to 3000 angstrom by sputtering in argon atmosphere of 8 mTorr using $WSi_x$ (x: 2.4) as the target. Subsequently, dry etching is performed in a predetermined region to form the gate electrodes 14 and 34 and the gate wiring layer 50 (FIG. 6).

Figure 9:
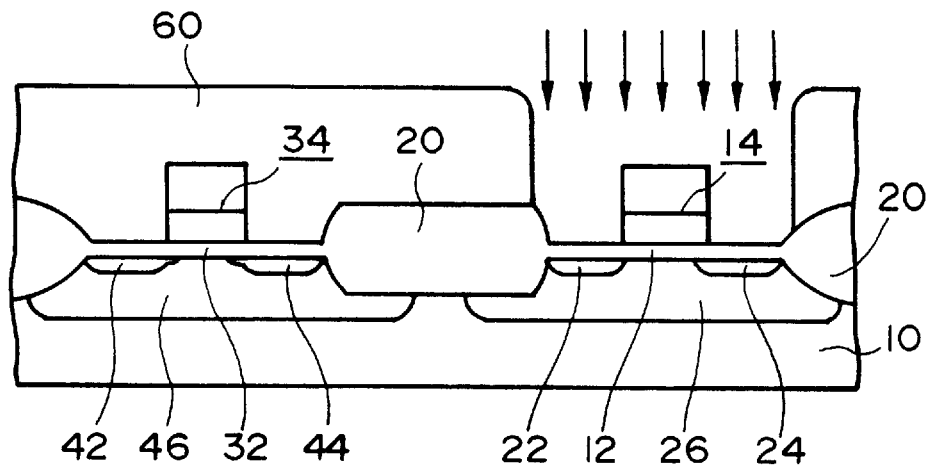
FIG. 9 is a schematic cross-sectional view showing the state in which a resist mask has been formed and the manner in which a III group dopant is implanted, illustrating one step of the manufacturing process of the CMOSFET of FIG. 5.
Figure 10:
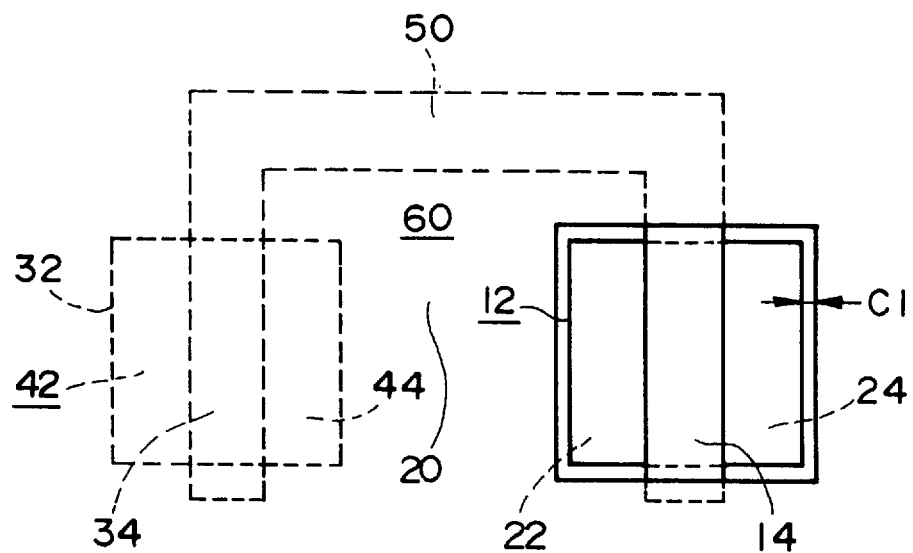
FIG. 10 is a schematic plan view showing the mask region formed in the step of FIG. 9.

(C) As shown in FIGS. 9 and 10, a resist mask 60 having an opening in an active region (a region in which the gate oxide film 12 is formed) of the p-channel regions is formed. The resist mask 60 serves, as also shown in FIG. 10, to mask the regions except the active region, in which the gate oxide film 12 is formed, namely, to mask entirely the n-channel regions and the element isolation region 20 as well as the polycide gate wiring layer 50 formed over the element isolation region 20. In the resist mask 60, an opening is formed with each side enlarged by a clearance C1 in view of a possible mask alignment error.

Then, the source/drain regions 22 and 24 are formed by doping $BF_2$ or B as III group dopant by ion implantation under the conditions that, for example, the amount of ion implantation is $(1 \text{ to } 8) \times 10^{15}$ $cm^{-2}$ and the implantation energy is 5 to 80 KeV. By this ion implantation, the maximum local impurity concentration of the source/drain regions 22 and 24 will be $(1 \text{ to } 3) \times 10^{20}$ atoms $cm^{-3}$ upon completion of the device manufacturing process. When doping the impurities, a silicon oxide 16 film of about 100 to 400 angstrom is formed usually in the doping region.

Figure 11:
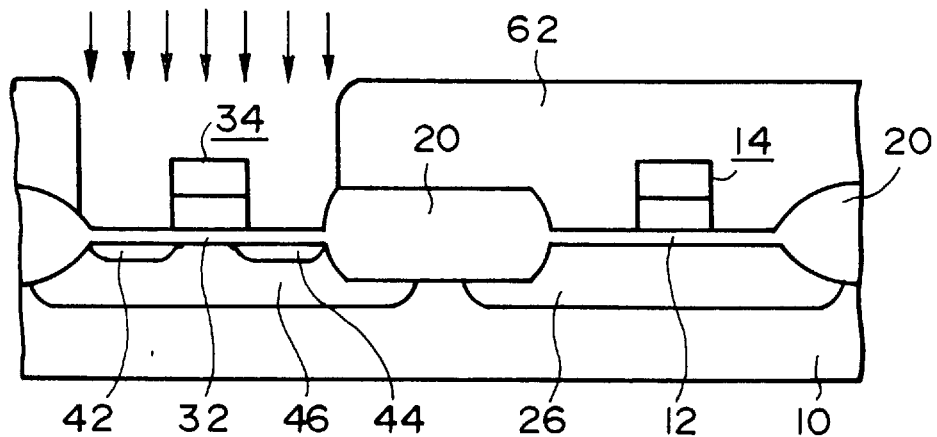
FIG. 11 is a schematic cross-sectional view showing the state in which a mask has been formed and the manner in which a V group dopant is implanted, illustrating one step of the manufacturing process for the CMOSFET of FIG. 5.
Figure 12:
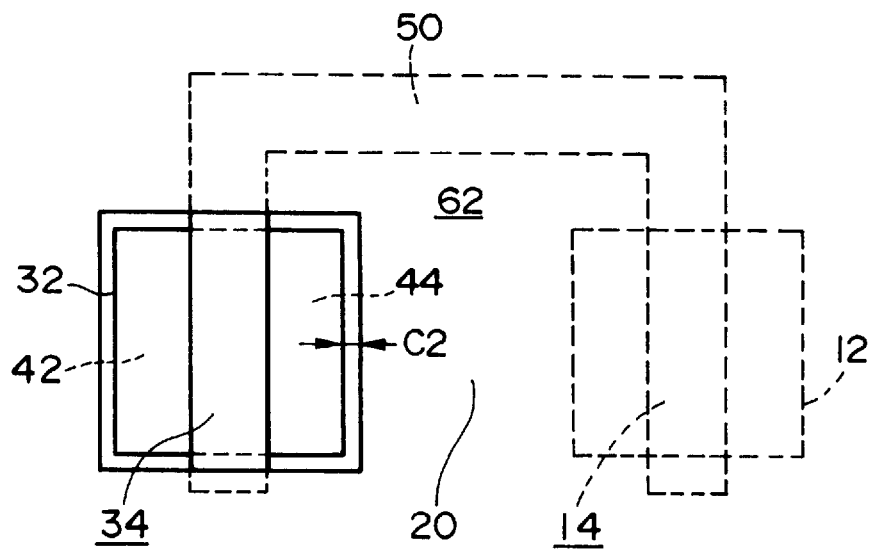
FIG. 12 is a schematic plan view showing the mask region formed in the step of FIG. 11.

(D) As shown in FIGS. 11 and 12, a resist mask 62 having an opening in an active region (a region in which the gate oxide film 32 is formed) of the n-channel region is formed. The resist mask 62 serves to mask the regions except the active region, in which the gate oxide film 32 is formed, namely, to mask entirely the p-channel regions and the element isolation region 20 as well as the gate wiring layer 50 formed over the element isolation region 20. In the resist mask 62, an opening is formed with each side enlarged by a clearance C2 in view of a possible mask alignment error.

Then, the source/drain regions 42 and 44 are formed by doping As or P as V group dopant by ion implantation under the conditions that, for example, the amount of ion implantation is $(1 \text{ to } 8) \times 10^{15}$ $cm^{-2}$ and the implantation energy is 5 to 80 KeV. By this ion implantation, the maximum local impurity concentration of the source/drain regions 42 and 44 will be $(1 \text{ to } 3) \times 10^{20}$ atoms cm-3 upon completion of the device manufacturing process.

In the steps (C) and (D) above, when forming the source/drain region, a dopant implantation region is limited to the active region. As a result, an excessive dopant will not be implanted in the field region (element isolation region) 20 and the polycide gate wiring layer 50, formed in the field region. Therefore, in the polycide gate wiring layer 50, there scarcely exists the III group dopant, and there exists the V group dopant in a concentration of no more than $1 \times 10^{20}$ atoms $cm^{-3}$.

Figure 13:
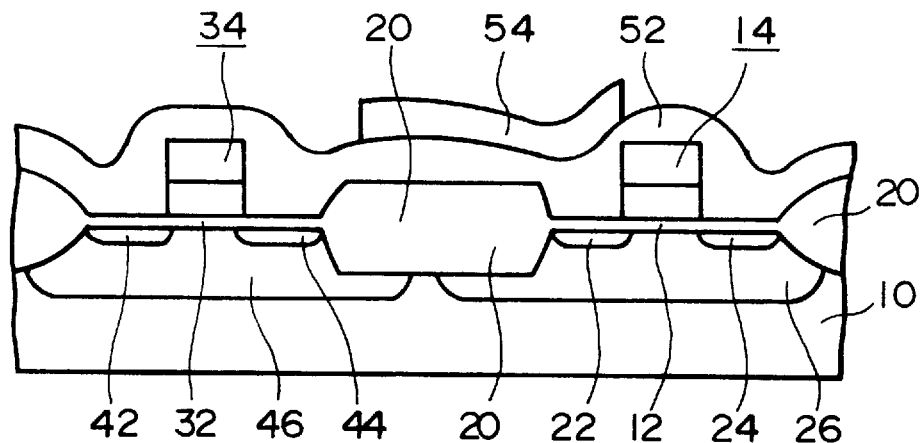
FIG. 13 is a schematic cross-sectional view showing the state in which an interlayer insulating film and a polysilicon wiring layer have been formed, illustrating one step of the manufacturing process for the CMOSFET of FIG. 5.

(E) As shown in FIG. 13, an interlayer insulating film (PSG) 52 is formed over the element surface by the ordinary method, and over the interlayer insulating film 52, a TFT (Thin Film Transistor) or a high-resistance polysilicon gate wiring layer 54 is formed.

Figure 14:
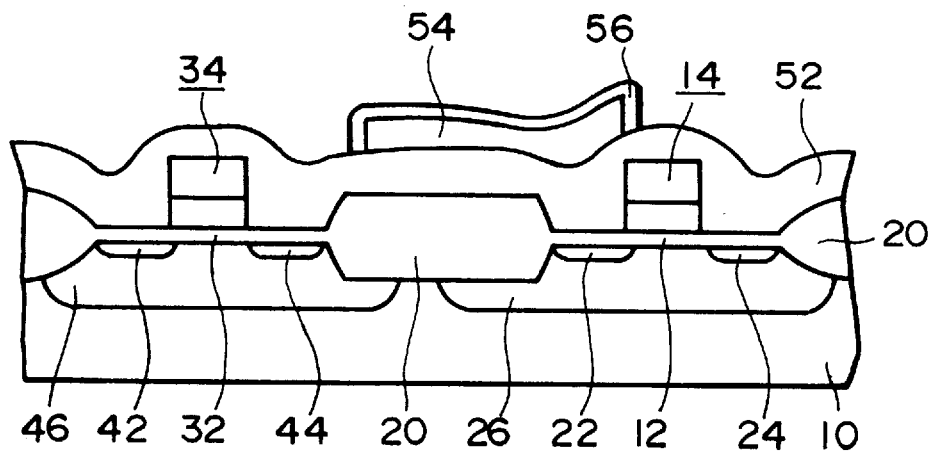
FIG. 14 is a schematic cross-sectional view showing the state in which an oxide film has been formed, illustrating one step of the manufacturing process for the CMOSFET of FIG. 5.

(F) Subsequently, as shown in FIG. 14, the surface of the TFT or polysilicon gate wiring layer 54 is oxidized by heat treatment to form an oxide film 56. The oxide film 56 serves as a TFT gate or as a high-resistance stabilizing protective film.

By heat treatment of this step, phosphorus doped into the polysilicon layers 14a and 34a in the step (B) is diffused also in the molybdenum silicide layers 14b and 34b. As a result, in the gate electrodes 14 and 34, phosphorus locally does not exist in a concentration of more than $3 \times 10^{20}$ atoms $cm^{-3}$.

With the semiconductor device formed by the foregoing process, it is possible to effectively prevent the gate electrode, especially the gate electrode 14 of the pMOSFET 100 from being reduced in thickness, for the following reasons:

(1) In the field region 20, there does not exist the V group dopant in high concentration, and there scarcely exists the III group dopant. Accordingly, in the gate electrode 14, the V group dopant and the III group dopant do not coexist in high concentration by diffusion of V group atoms As and P, and as a result, there would not occur any abnormal accelerated oxidation.

In the conventional art, since the mask is not formed over the field region 20 when forming the diffusion layer of the source/drain regions, the III group and V group atoms are implanted in the polycide electrode in the field region in high concentration. And since the rate of diffusion of the V group atoms (As, P) in the metal silicide layer is very high, As and P would be diffused even into the gate electrode 14 of the pMOSFET during the thermal oxidation treatment, which is subsequent. Therefore, in the polycide electrode 14a of the PMOSFET 100, the V group and III group atoms coexist in high concentration so that abnormal accelerated oxidation would occur.

(2) In the manufacturing method of this invention, before the high-temperature oxidation treating step takes place as the final stage of the manufacturing process, the constitutional ratio of Si in the metal silicide layers 14b and 34b of the gate electrodes 14 and 34 is set to be greater than the stoichiometrical ratio, namely, compared to $MSi_2$ (M: metal). Accordingly, in this oxidation treatment, Si in the metal silicide layers 14b and 34b would be consumed so that Si in the polysilicon layers 14a and 34a, which are situated under the respective metal silicide layers 14b and 34b, would be not consumed, thus preventing the polysilicon layers 14a and 34a from being reduced in thickness.

In the semiconductor device manufacturing method of this embodiment, at the source/drain region forming stage, it is required that in a region of the gate electrode 34 of nMOSFET 200, the V group element, As, Sb or P, should not exist in a concentration of more than $5\times10^{20}$ atoms $cm^{-3}$, and B or $BF_2$ should not coexist in a concentration of more than $1\times10^{19}$ atoms $cm^{-3}$. It is also required that in an arbitrary region of the polycide gate electrode 14 of pMOSFET 100, the III group atoms, B or $BF_2$ should not exist in a concentration of more than $2\times10^{20}$ atoms $cm^{-3}$.

Second Embodiment

In this embodiment, when a dopant is implanted to form a source/drain region, the dopant is substantially not implanted in a gate electrode.

Figure 15:
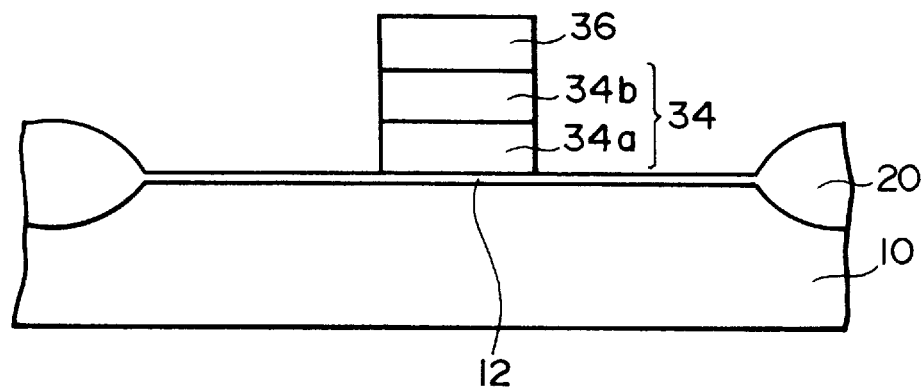
FIG. 15 is a schematic cross-sectional view showing the state in which a gate electrode has been formed, illustrating one step of the manufacturing process for a CMOSFET according to a second embodiment of the invention.
Figure 16:
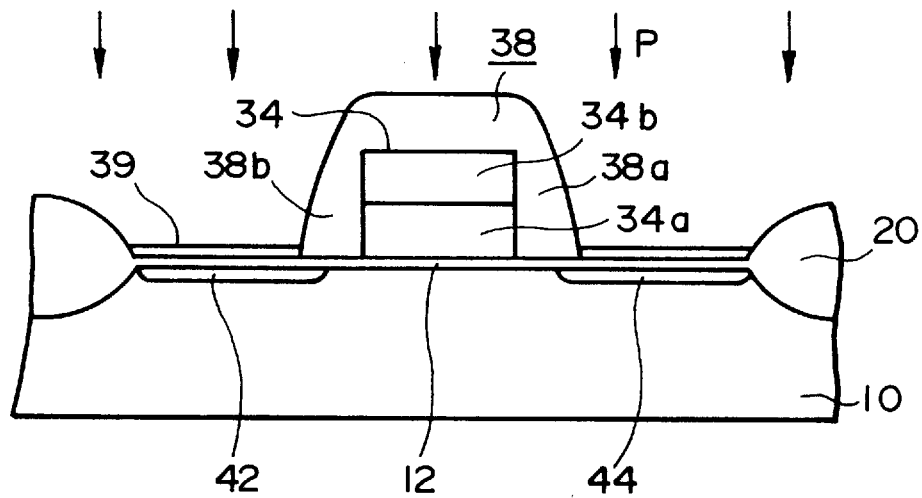
FIG. 16 is a schematic cross-sectional view showing the state in which an oxide film has been formed on the surface of the gate electrode and the manner in which the dopant is implanted, illustrating a step subsequent to the step of FIG. 15.

FIGS. 15 and 16 schematically show the manufacturing process for an n-channel MOSFET constituting a CMOSFET of this embodiment.

As shown in FIG. 15, on a silicon substrate 10, an element isolation region 20 is formed and then a gate oxide film 12 is formed. On the gate oxide film 12, a polysilicon layer 34a, a metal silicide layer 34b and a silicon oxide film 36 are formed in laminate. In the polysilicon layer 34a, phosphorus is doped in a concentration of $2\times10^{20}$ atoms $cm^{-3}$.

After an oxide film has been formed on the entire surface of a wafer by CVD, etching is performed to leave side walls 38a and 38b, as shown in FIG. 16. At that time, on the surface of the gate electrode 34, an insulating film 38, which is composed of an insulating film resulting from the oxide film 36 and of the side walls 38a and 38b, is formed. The insulating film 38 has a thickness larger than the projected range of dopant ions and prevents the dopant from being implanted in the gate electrode 34. For example, since the projected range of dopant ions when $BF_2$ is implanted by acceleration energy of 50 keV is 461 angstrom, the insulating film 38 has a thickness larger than at least 461 angstrom, preferably more than 1196 angstrom in order to cover three times the implantation distribution standard deviation of 245 angstrom.

On the gate oxide films 12 at opposite sides of the gate electrode 34, an oxide silicon film 39 having a thickness smaller than the projected range of dopant ions is formed.

Then, phosphorus is doped by ion implantation. As a result, phosphorus is implanted in the source/drain regions 42, 44 but is scarcely doped in the gate electrode 34.

Figure 17:
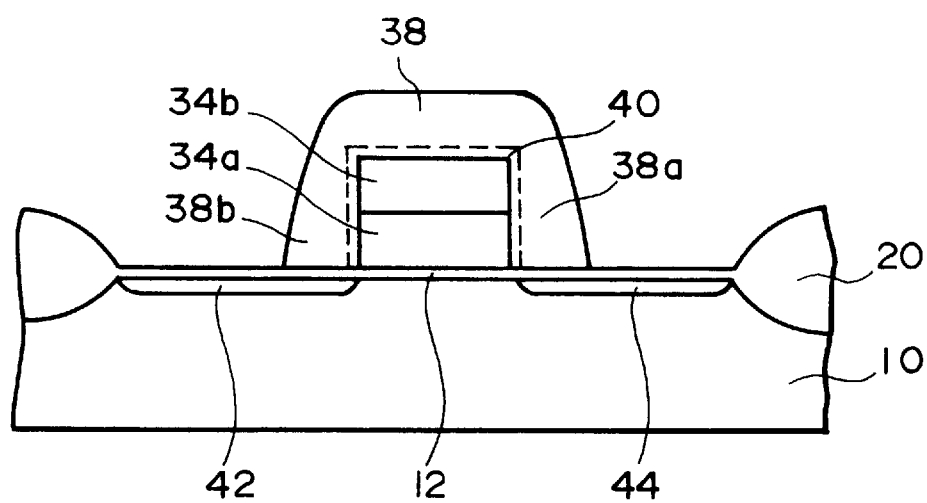
FIG. 17 is a schematic cross-sectional view of the CMOSFET according to the second embodiment, showing the state in which a heat oxide film has been formed by high temperature oxidation treatment after the gate electrode had been formed.

In the n-channel MOSFET obtained by this method, as shown in FIG. 17, a thermal oxide film 40 to be formed during high temperature treatment after forming the gate electrode is composed of nearly intrinsic $SiO_2$ containing no impurities or containing low-concentration phosphorus. Partly since the diffusion constant of oxidizing atoms (O, OH) in the oxide film is small, and partly since the rate of oxidation of the metal silicide layer 34b is small, no abnormal oxidation would occur. Therefore, silicon of the polysilicon layer 34a as the foundation layer is free from being implanted into the surface of the silicide layer 34b so that the polysilicon layer 34a will not be consumed.

The foregoing description in connection with the n-channel MOSFET can be also applied to the p-channel MOSFET. Namely, in the step shown in FIG. 16, if the kind of dopant is substituted by a p-type dopant (B), it is possible to obtain a p-channel MOSFET which is free from reduction in thickness.

In this embodiment, by not implanting the dopant in the gate electrode when forming the source/drain diffused region, it is possible to avoid coexistence of III group and V group dopants in high concentration, thus preventing abnormal accelerated oxidation.

Third through sixth embodiments of this invention will now be described. These embodiments have a distinguishing feature in the dopant distribution of the gate electrode layer at a border region between pMOSFET and nMOSFET.

Third Embodiment

Figure 18:
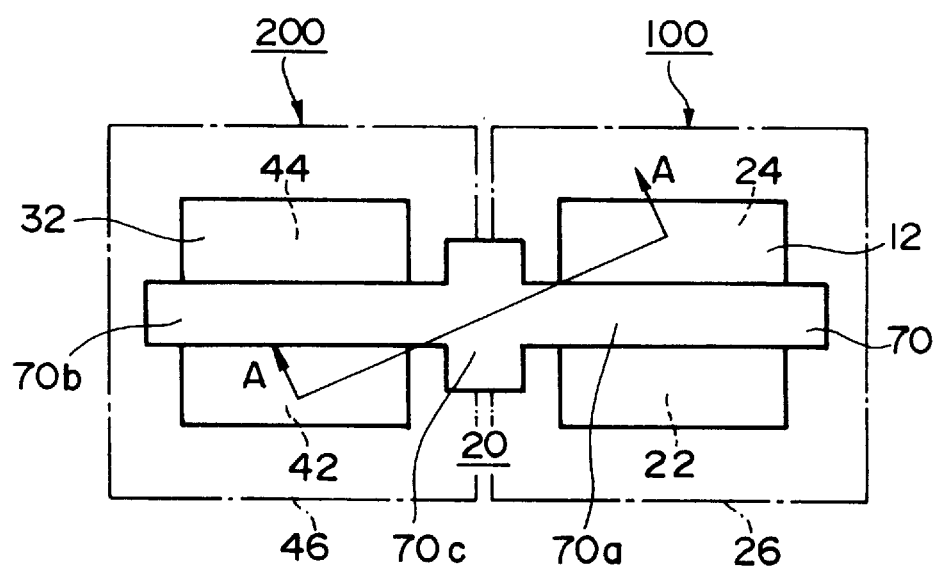
FIG. 18 is a schematic plan view showing the principal part of a CMOSFET according to a third embodiment of the invention.

FIG. 18 is a schematic plan view showing the principal part of a semiconductor device of this embodiment.

In the semiconductor device, a pMOSFET 100 and an nMOSFET 200 are connected to each other by a linear gate electrode layer 70. The basic structure of the pMOSFET 100 and the nMOSFET 200 is identical to that of the semiconductor device of the first embodiment (FIGS. 5 and 6). The parts or elements identical in function to those of the first embodiment are designated by same reference numerals. Namely, the pMOSFET 100 includes source/drain regions 22 and 24 formed in an n-type well 26, a gate oxide film 12, and a gate electrode layer 70 formed between the source/drain regions 22 and 24. Likewise, the nMOSFET 200 includes source/drain regions 42 and 44 formed in a p-type well 46, a gate oxide film 32, and the gate electrode layer 70. The gate electrode layer 70 includes a gate electrode 70a of the pMOSFET 100, a gate electrode 70b of the nMOSFET 200, and a gate wiring layer 70c interconnecting these gate electrodes 70a, 70b to one another. The active region of the PMOSFET 100 and that of the nMOSFET 200 are separated from each other by an element isolation region 20.

FIGS. 19A through 19D are schematic cross-sectional views taken along line A—A of FIG. 18, showing one example of manufacturing method for the semiconductor device of this embodiment.

(A) On a p-type silicon substrate 10, in which an n-type well 26 and a p-type well 46 are formed and which has a specific resistance of 8 to 12 (Ωcm), gate oxide films 12 and 32 of 40 nm were formed by thermal oxidation for 20 minutes in a dry oxygen atmosphere of 1000° C., whereupon a tungsten silicide layer as a gate electrode material was deposited to a thickness of 300 nm by sputtering. This sputtering took place for 60 seconds by an electric power of 1.5 kW using argon gas pressurized at 2.8 mTorr. At that time, the constitutional ratio of the sputter target was W:Si= 1:3.0.

Figure 19A:
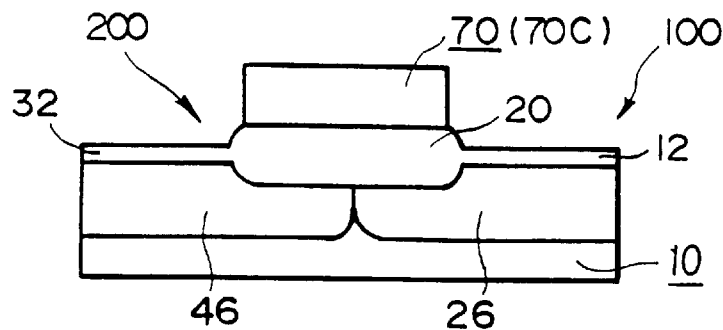
FIGS. 19A through 19D are schematic cross-sectional views showing the manufacturing process for the CMOSFET of FIG. 18.
Figure 19B:
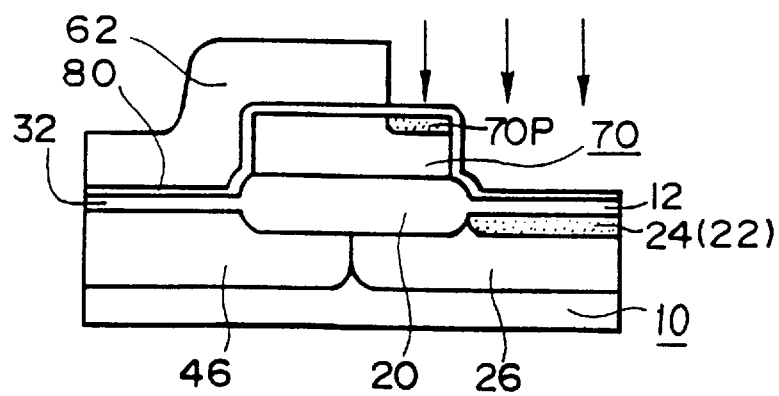

Further, after predetermined patterning by photolithography using a positive resist, the tungsten silicide layer was dry-etched to form the gate electrode layer 70 (FIG. 19A).

This etching took place for about 60 seconds by an electric power of 150 W using $SF_6$ and $Cl_2$ gas pressurized at 0.6 Torr. Further, the tungsten silicide layer was oxidized for 30 seconds in $O_2$ atmosphere of 900° C.

(B) Then, a silicon oxide 80 deposited to a thickness of 10 nm by CVD. The accumulation took place during thermal treatment for 15 minutes at 780° C. in $N_2O+CH_4$ gas pressurized at 200 Pa. After forming a resist mask 62, which has an opening in the pMOS region, by photolithography, ionized boron (B+) was implanted in $8\times10^{15}$ atoms $cm^{-2}$ by an acceleration energy of 30 keV (FIG. 19B), thus forming the source/drain regions 22 and 24. At the same time, boron was doped also into part of the gate electrode layer 70 contiguous to the source/drain regions 22 and 24 to form a p-type diffused region 70P.

(C) Then, after removal of the resist mask 62, a resist mask 64 having an opening in the nMOS region was formed by photolithography, whereupon ionized phosphorus (P+) was implanted in $8\times10^{12}$ (atoms $cm^{-2}$) by an acceleration energy of 40 keV.

Figure 19C:
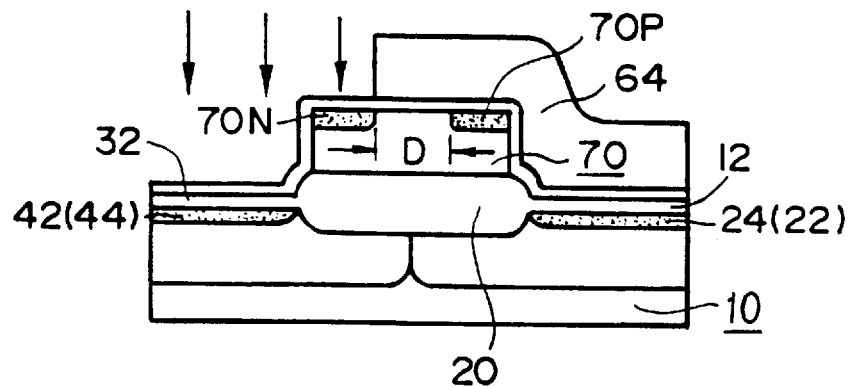

At that time, the resist mask 62 and the resist mask 64 should overlap each other's end by 4 μm so that in the gate electrode layer 70, the region 70N with phosphorus ion implanted is spaced apart by about 4 μm from the region 70P with boron ion implantation. This distance depends on a position error of the resist mask or the temperature of thermal treatment, which is to take place subsequently. But since thermal treatment of about 800° C. is necessary in order to activate the impurities, the distance D of at least 1 μm is needed in view of its diffusion (FIG. 19C).

Figure 19D:
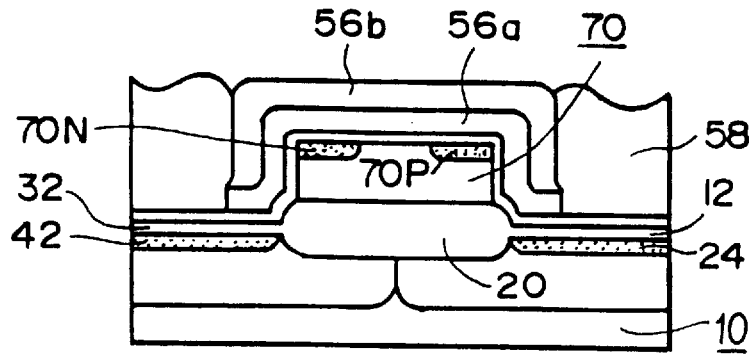

(D) After depositing a first interlayer film ($SiO_2$ film) 56a in 200 nm at 400° C. by thermal decomposition (CVD) of $SiH_4+O_2$ gas, wet oxidation took place for 30 minutes at 850° C. to activate the impurities. Then, a second interlayer film ($SiO_2$ film) 56b was deposited to a thickness of 200 nm as by CVD, whereupon contact holes were formed. Further, a wiring metal such as a Al—Si (1% content) layer was evaporated, and this wiring metal layer was treated by photolithography and dry etching to leave wiring portions, forming a wiring layer 58 (FIG. 19D).

In the semiconductor device thus formed, since the region with the III group element (B) implanted and the region with the V group element (P) implanted are spaced apart in the gate electrode layer 70 by a predetermined distance, for example, at least 1 μm as they are doped when forming the source/drain region, these dopant do not coexist even if diffused from each other. Therefore, phosphorus and boron do not coexist in the same region in a concentration of $1\times10^{18}$ (atoms $cm^{-3}$) or higher so that even when wet oxidation treatment takes place for subsequent thermal treatment, no abnormal oxidation will occur to prevent the constitutional ratio of Si in the tungsten silicide layer 70 from being less than 2, which secures the gate breakdown characteristic of the gate not to be deteriorated.

Fourth Embodiment

FIGS. 20A through 20D show one example of manufacturing method for the semiconductor device of this embodiment. This embodiment is different from the third embodiment in an aspect that the gate electrode layer has a polycide structure.

(A) On a p-type silicon substrate 10, in which an n-type well 26 and a p-type well 46 are formed and which has a specific resistance of 8 to 12 (Ωcm), gate oxide films 12 and 32 of 40 nm were formed by thermal oxidation for 20 minutes in a dry oxygen atmosphere of 1000° C., whereupon a polysilicon layer as a gate electrode material was firstly deposited to a thickness of 200 nm by CVD, i.e. thermal decomposition of $SiH_4$ at 630° C., 100 mTorr. Then, $POCl_3$ was supplied to a reactor with a flow of 1 liter/minute at 900° C. to implant phosphorus in the polysilicon layer in a concentration of $5\times10^{20}$ atoms $cm^{-3}$, thus forming an n-type polysilicon layer 72. The oxide film formed on the polysilicon layer 72 by this thermal treatment was removed by soaking the sample for two minutes in a fluoric acid solution containing fluoric acid and water at a ratio of 1:10 and was further treated by washing in water and drying. Thereafter, a tungsten silicide layer 74 was deposited to a thickness of 300 nm by sputtering. This sputtering took place for 60 seconds by an electric power of 1.5 kW using argon gas pressurized at 2.8 mTorr. At that time, the constitutional ratio of the sputter target was W:Si=1:2.4.

Figure 20A:
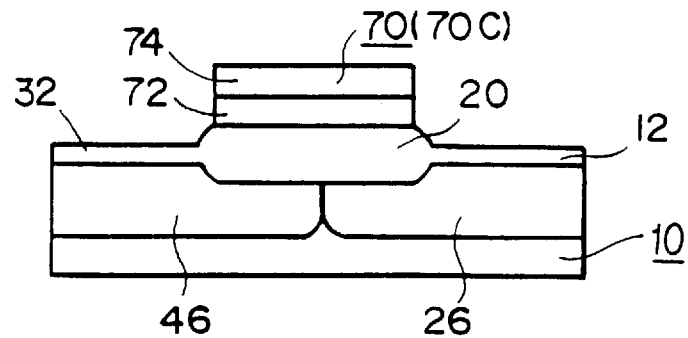
FIGS. 20A through 20D are schematic cross-sectional views showing the manufacturing process for a CMOSFET according to a fourth embodiment of the invention.
Figure 20B:
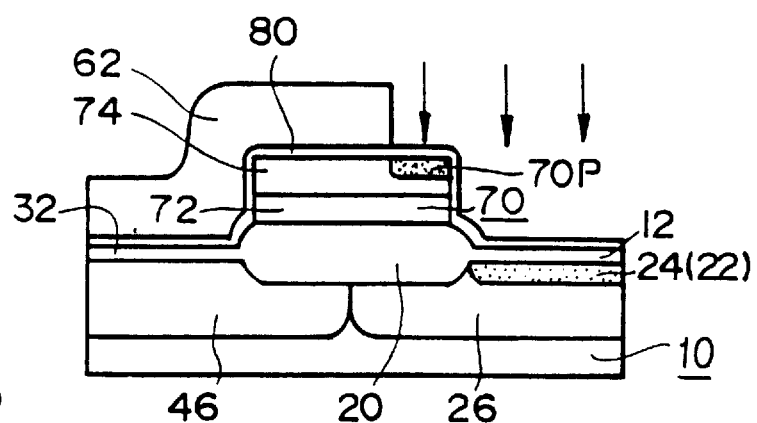

Further, after predetermined patterning by photolithography using a positive resist, the tungsten silicide layer 74 and the polysilicon layer 72 were dry-etched (FIG. 20A). This etching for the tungsten silicide layer 74 took place for about 60 seconds by an electric power of 150 W using $SF_6$ and $Cl_2$ gas pressurized at 0.6 Torr. This etching for the polysilicon layer 72 took place for about 60 seconds by an electric power of 150 W using $Cl_2$ gas pressurized at 0.6 Torr. Further, the substrate 10 treated with the tungsten silicide layer 74 was heat treated 30 seconds $O_2$ atmosphere of 900° C. to form silicide.

(B) Then, an oxide silicon layer 80 was deposited to a thickness of 10 nm by CVD. The deposition took place during thermal treatment for 15 minutes at 780° C. in $N_2O+CH_4$ gas pressurized by 200 Pa. After forming a resist mask 62, which has an opening in the PMOS region, by photolithography, ionized boron (B+) was implanted in $8\times10^{15}$ atoms $cm^{-2}$ by an acceleration energy of 30 keV (FIG. 20B), thus forming the source/drain regions 22 and 24. At the same time, a p-type diffused region 70P was formed on the silicide layer 74 of the gate electrode layer 70.

Figure 20C:
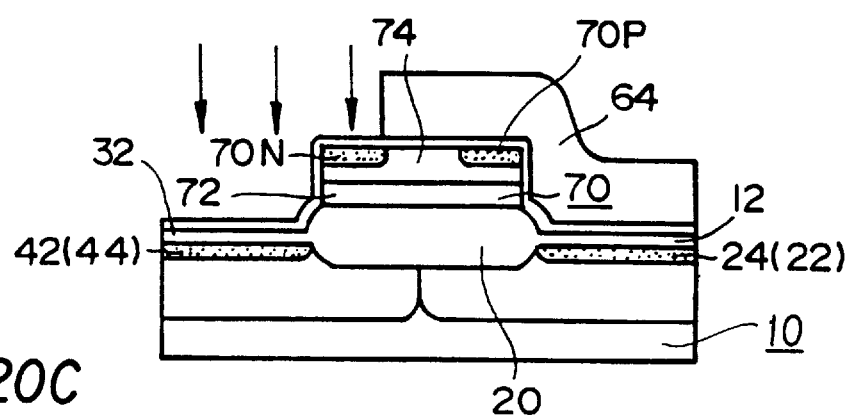

(C) Then, after removal of the resist mask 62, a resist mask 64 was formed in the nMOS region having an opening by photolithography, whereupon ionized phosphorus (P+) was implanted in $8\times10^{12}$ (atoms $cm^{-2}$) by an acceleration energy of 40 keV. At that time, like the third embodiment, in the gate electrode layer 70, the region 70N with phosphorus ion implanted is spaced apart by about 4 μm from the region 70P with boron ion implantation. This distance depends on a position error of the resist mask or the temperature of thermal treatment, which is to take place subsequently. But since thermal treatment of about 800° C. is necessary in order to activate the impurities, the distance D of at least 1 μm is needed in view of its diffusion (FIG. 20C).

Figure 20D:
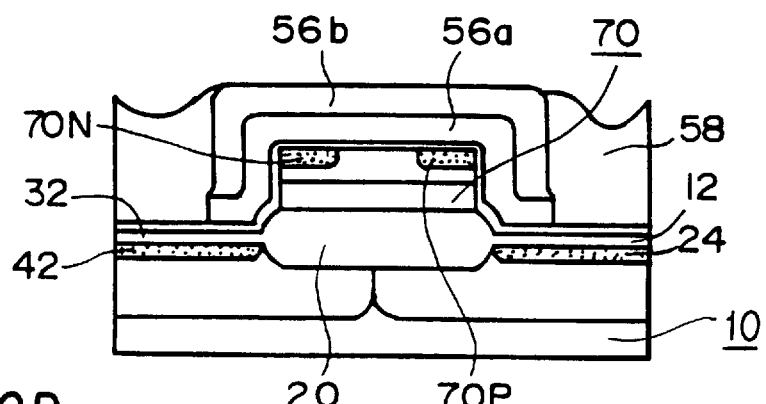

(D) After depositing a first interlayer film 56a in 200 nm at 400° C. by thermal decomposition (CVD) of $SiH_4+O_2$ gas, wet oxidation took place for 30 minutes at 850° C. to activate the impurities. Then, a second interlayer film 56b was deposited to a thickness of 200 nm as by CVD, whereupon contact holes were formed. Further, a wiring metal such as a Al—Si (1% content) layer was evaporated, and this wiring metal layer was treated by photolithography and dry etching to leave wiring portions, forming a wiring layer 58 (FIG. 20D).

In the semiconductor device thus formed, since the region with the III group element (B) implanted and the region with the V group element (P) implanted are spaced apart by, at least 1 μm in the gate electrode layer 70, these dopant do not exist in concentration of $1\times10^{18}$ atoms $cm^{-3}$ or higher even if diffused from each other. Further, phosphorus doped in the polysilicon layer 72 in the step (A) is diffused also in the tungsten silicide layer 74 by thermal treatment, but the concentration of phosphorus does not locally exceed $3\times10^9$ atoms $cm^{-3}$. Therefore, even when wet oxidation treatment takes place for subsequent thermal treatment, no abnormal oxidation will occur to prevent the constitutional ratio of Si in the tungsten silicide layer 74 from being less than 2, which secures the gate breakdown characteristic of the gate not to be deteriorated.

Fifth Embodiment

FIGS. 21A through 21D show one example of manufacturing method for the semiconductor device of this embodiment. This embodiment is different from the third embodiment in an aspect that the gate electrode layer has a double-layer structure composed of a metal silicide layer and a silicon oxide layer.

(A) On a p-type silicon substrate 10, in which an n-type well 26 and a p-type well 46 are formed and which has a specific resistance of 8 to 12 ($\Omega$cm), gate oxide films 12 and 32 of 40 nm were formed by thermal oxidation for 20 minutes in a dry oxygen atmosphere of 1000° C., whereupon a tungsten silicide layer 74 as a gate electrode material was deposited to a thickness of 300 nm by sputtering. This sputtering took place for 60 seconds by an electric power of 1.5 kW using argon gas pressurized at 2.8 mTorr. At that time, the constitutional ratio of the sputter target was W:Si= 1:3.0. Then, a silicon oxide layer 76 was deposited to a thickness of 200 nm by CVD. During this deposition, $N_2O+SiCl_2H_2$ was decomposed by heat at 780° C. under a pressure of 50 Pa. for a reaction time of about 20 minutes.

Figure 21A:
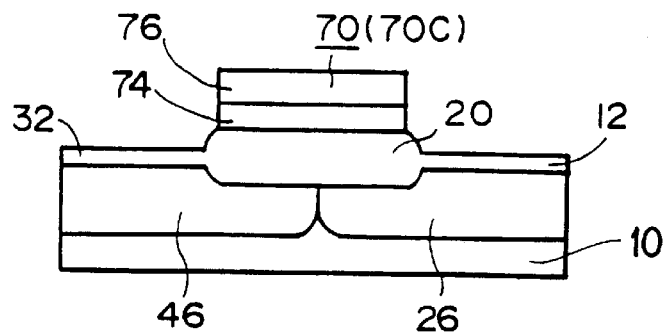
FIGS. 21A through 21D are schematic cross-sectional view showing the manufacturing process for a CMOSFET according to a fifth embodiment of the invention.
Figure 21B:
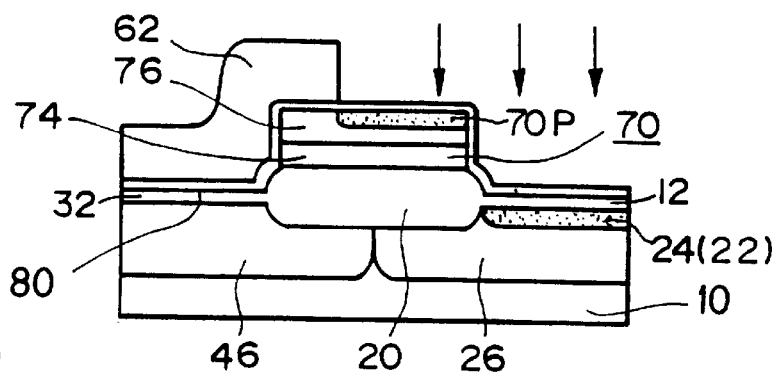

Further, after predetermined patterning by photolithography using a positive resist, the silicon oxide layer 76 and the tungsten silicide layer 74 were dry-etched (FIG. 21A). This etching for the silicon oxide layer 76 took place at an etching rate of 1100 nm/minute by an electric power of 16 $W/cm^2$ using $CHF_3$ gas pressurized at 5 mTorr. This etching for the tungsten silicide layer 74 took place for about 60 seconds by an electric power of 150 W using $SF_6$ and $Cl_2$ gas pressurized at 0.6 Torr. Further, this substrate 10 treated with the tungsten silicide layer 74 was heat treated for 30 seconds in $O_2$ atmosphere of 900° C. to form silicon oxide.

(B) Then, a silicon oxide layer 80 was deposited to a thickness of 10 nm by CVD. The accumulation proceeded during thermal treatment for 15 minutes at 780° C. in $N_2O+CH_4$ gas pressurized by 200 Pa. After forming a resist mask 62, which has an opening in the pMOS region, by photolithography, ionized boron ($B^+$) was implanted in $8\times10^{15}$ atoms $cm^{-2}$ by an acceleration energy of 30 keV (FIG. 21B), thus forming the source/drain regions 22 and 24. At the same time, a p-type diffused region 70P was formed on the silicon oxide layer 76.

Figure 21C:
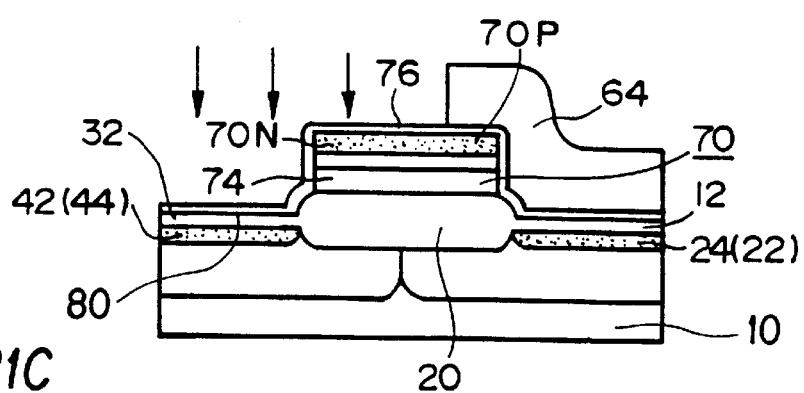

(C) Then, after removal of the resist mask 62, a resist mask 64 having an opening in the nMOS region was formed by photolithography, whereupon ionized arsenic ($As^+$) was implanted in $8\times10^{12}$ (atoms $cm^{-2}$) by an acceleration energy of 40 keV, forming an n-type diffused region 70N on the silicon oxide film 76. By this ion implantation of boron fluoride and arsenic, boron and arsenic are implanted in the silicon substrate, but both boron and arsenic are scarcely implanted in the tungsten silicide layer 74. This is because there is the oxide silicon layer 76 over the tungsten silicide layer 74 so that most of both boron and arsenic would be moved into the silicon oxide layer 76 (FIG. 21C).

Figure 21D:
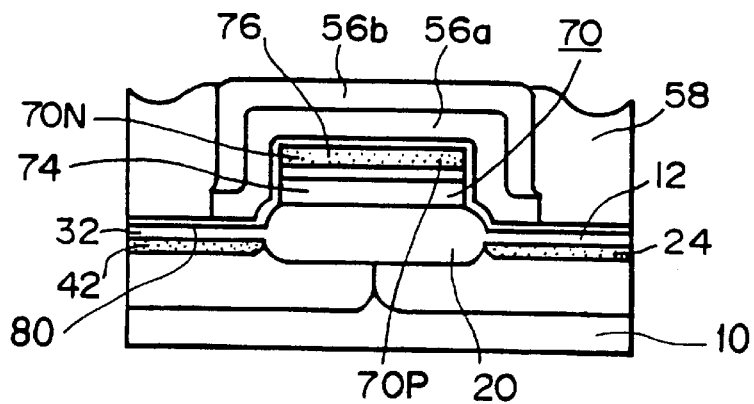

(D) After depositing a first interlayer film 56a in 200 nm at 400° C. by thermal decomposition (CVD) of $SiH_4+O_2$ gas, wet oxidation took place for 30 minutes at 850° C. to activate the impurities. Then, a second interlayer film 56b was deposited to a thickness of 200 nm as by CVD, whereupon contact holes were formed. Further, a wiring metal such as a Al—Si (1% content) layer was evaporated, and this wiring metal layer was treated by photolithography and dry etching to leave prospective wiring portions, forming a wiring layer 58 (FIG. 21D).

In the semiconductor device thus formed, there scarcely exist the III group and V group impurities in the tungsten silicide layer 74 so that even when wet oxidation treatment takes place during subsequent thermal treatment, no abnormal oxidation will occur to prevent the constitutional ratio of Si in the tungsten silicide layer 74 from being less than 2, which secures the pressure-resisting characteristic of the gate not to be deteriorated.

Sixth Embodiment

FIGS. 22A through 22D show one example of manufacturing method for the semiconductor device of this embodiment.

This embodiment is different from the third embodiment in an aspect that the gate electrode layer has a triple-layer structure composed of a polysilicon layer. a metal silicide layer and an oxide silicon layer.

Figure 22A:
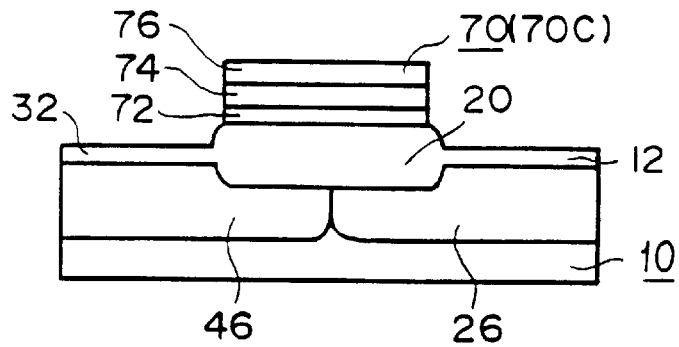
FIGS. 22A through 22D are schematic cross-sectional view showing the manufacturing process for a CMOSFET according to a sixth embodiment of the invention.
Figure 22B:
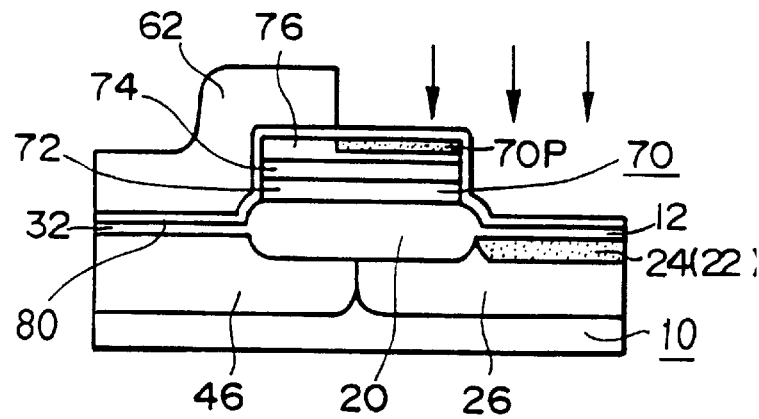

(A) On a p-type silicon substrate 10, in which an n-type well 26 and a p-type well 46 are formed and which has a specific resistance of 8 to 12 ($\Omega$cm), gate oxide films 12 and 32 of 40 nm were formed by thermal oxidation for 20 minutes in a dry oxygen atmosphere of 1000° C., whereupon a polysilicon layer as a gate electrode material was firstly deposited to a thickness of 200 nm by CVD. Then, $POCl_3$ was supplied to a reactor in a flow of 1 liter/minute at 900° C. to implant phosphorus in the polysilicon layer in a concentration of $5\times10^{20}$ atoms $cm^{-3}$, thus forming an n-type polysilicon layer 72. The oxide film formed on the polysilicon layer 72 by this thermal treatment was removed by soaking the sample for two minutes in a fluoric acid solution containing fluoric acid and water at a ratio of 1:10 and was further treated by washing in water and drying. Then a tungsten silicide layer 74 was deposited to a thickness of 200 nm by sputtering. This CVD for polysilicon layer 72 took place by thermal decomposition of $SiH_4$ at 630° C. under a pressure of 100 mTorr. This sputtering for the tungsten silicide layer 74 took place for 60 seconds by an electric power of 1.5 kW using argon gas pressurized at 2.8 mTorr. At that time, the constitutional ratio of the sputter target was W:Si=1:2.5. Then, a silicon oxide layer 76 was deposited to a thickness of 200 nm by CVD. During this deposition, $N_2O+SiCl_2H_2$ was decomposed by heat at 780° C. under a pressure of 50 Pa. for a reaction time of about 20 minutes. (FIG. 22A).

Further, after predetermined patterning by photolithography using a positive resist, the silicon oxide layer 76, the tungsten silicide layer 74 and the polysilicon layer 72 were dry-etched. This etching for the silicon oxide layer 76 took place at an etching rate of 1100 nm/minute by an electric power of 16 $W/cm^2$ using $CHF_3$ gas pressurized at 5 mTorr. This etching for the tungsten silicide layer 74 took place for about 60 seconds by an electric power of 150 W using $SF_6$ and $Cl_2$ gas pressurized at 0.6 Torr. This etching for the polysilicon layer 72 took place for about 60 seconds by an electric power of 150 W using $Cl_2$ gas pressurized at 0.6 Torr. Further, the tungsten silicide layer 74 was treated for 30 seconds in 02 atmosphere of 900° C. to form silicide.

(B) Then, a silicon oxide layer 80 was deposited to a thickness of 10 nm by CVD. The accumulation proceeded during thermal treatment for 15 minutes at 780° C. in $N_2O+CH_4$ gas pressurized by 200 Pa. After forming a resist mask 62, which has an opening in the pMOS region, by photolithography, ionized boron fluoride ($BF_2^+$) was implanted in $8\times10^{15}$ atoms $cm^{-2}$ by an acceleration energy of 30 keV (FIG. 22B), thus forming the source/drain regions 22 and 24. At the same time, a p-type diffused region 70P was formed in the silicon oxide layer 76.

Figure 22C:
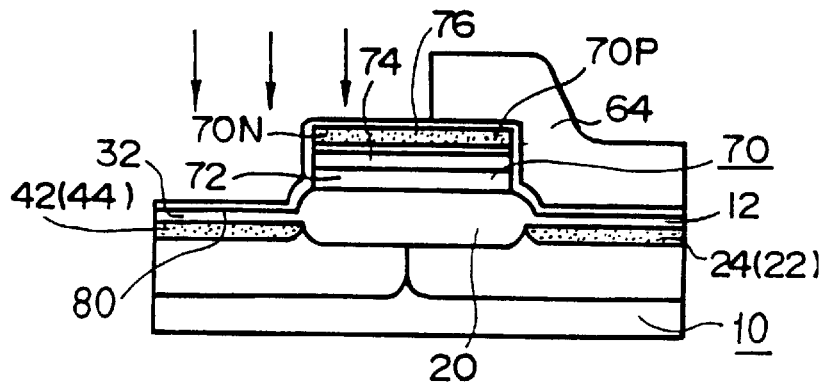

(C) Then, after removal of the resist mask 62, a resist mask 64 having an opening in the nMOS region was formed by photolithography, whereupon ionized arsenic (As+) was implanted in $8 \times 10^{12}$ (atoms $cm^{-2}$) by an acceleration energy of 40 keV, foaling an n-type diffused region 70N in the silicon oxide film 76. By this ion implantation of boron fluoride and arsenic, boron and arsenic are implanted in the silicon substrate, but both boron and arsenic are scarcely implanted in the tungsten silicide layer 74 and the polysilicon layer 72. This is because there is the silicon oxide layer 76 over the tungsten silicide layer 74 so that most of both boron and arsenic would be absorbed by the oxide silicon layer 76 (FIG. 22C).

Figure 22D:
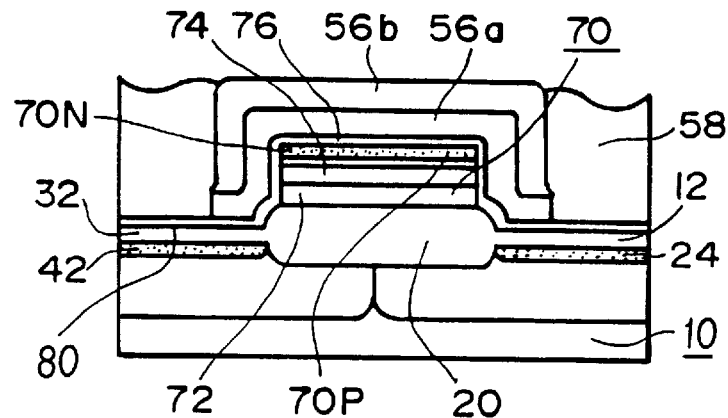

(D) After depositing a first interlayer film 56a in 200 nm at 400° C. by thermal decomposition (CVD) of $SiH_4+O_2$ gas, wet oxidation took place for 30 minutes at 850° C. to activate the impurities. Then, a second interlayer film 56b was deposited to a thickness 200 nm as by CVD, whereupon contact holes were formed. Further, a wiring metal such as a Al—Si (1% content) layer was evaporated, and this wining metal layer was treated by photolithography and dry etching to leave prospective wiring portions, forming a wiring layer 58 (FIG. 22D).

In the semiconductor device thus formed, there scarcely exist the III group and V group impurities in the tungsten silicide layer 74 so that even when wet oxidation treatment takes place during subsequent thermal treatment, no abnormal oxidation will occur to prevent the constitutional ratio of Si in the tungsten silicide layer 74 from being less than 2, which secures the pressure-resisting characteristic of the gate not to be deteriorated.

In the third through sixth embodiments, the III group and V group dopants do not coexist in high concentration in the metal silicide layer of the gate electrode layer located at a border region between the pMOSFET 100 and the nMOSPET 200 so that the gate electrode layer is prevented from abnormal oxidation.

FIG. 23 is a table showing the results of lot initial function tests conducted in connection with the yields of 1M bit SRAMs each containing the CMOSFET formed according to the first embodiment of the invention and those of 1M bit SRAMs each containing the CMOSFET formed by the conventional method. It turned out from the results that if this invention is applied, the yield can be improved remarkably (about 10% in the tests).

This invention should by no means be limited to the foregoing illustrated embodiments. The metal silicide is exemplified by $WSi_2$, $MoSi_2$, $CrSi_2$, $NiSi_2$, $VSi_2$, $CuSi_2$, $AuSi_2$, $AgSi_2$, $PtSi_2$, $PbSi_2$, $PdSi_2$, $MnSi_2$, $TiSi_2$, $FeSi_2$ and $CoSi_2$. Further, the CMOSFET may be an LDD structure which has been widely used in the art.

What is claimed is:

1. A method of manufacturing a semiconductor device, comprising the steps of:

(a) forming an element isolation region on a silicon substrate and then forming a gate oxide film for a CMOS element that includes a first MOS element and a second MOS element;

(b) forming gate electrodes and a gate wiring layer electrically interconnecting said gate electrodes, including at least a metal silicide layer;

(c) forming a first source/drain region by forming a first resist mask, which has a first opening only in a first active region of said first MOS element and covers a second active region, the element isolation region of said second MOS element, and the gate wiring layer, and then by doping impurities, which correspond to the polarity of said first MOS element, through said first opening; and (d) forming a second source/drain region, upon removal of said first resist mask, by forming a second resist mask, which has a second opening only in said second active region of said second MOS element and covers said first active region, the element isolation region of said first MOS element, and the gate wiring layer, and then by doping impurities, which correspond to the polarity of said second MOS element, via the second opening.

2. A semiconductor device manufacturing method according to claim 1, wherein in the steps (c) and (d), each of said first and second openings of said first and second resist masks, respectively, has a clearance.

3. A semiconductor device manufacturing method according to claim 1, wherein in the step (b), said metal silicide layer contains an stoichiometrically excessive amount of silicon compared to metal.

4. A semiconductor device manufacturing method according to claim 1, wherein said first MOS element is an n-channel MOS element and in said step of forming said first source/drain region of said n-channel MOS element, a V group dopant and a III group dopant are doped in a region of said gate electrode of said n-channel MOS element in a concentration of no higher than $5 \times 10^{20}$ atoms $cm^{-3}$ and in a concentration of no higher than $2 \times 10^{20}$ atoms $cm^{-3}$ respectively, and wherein said second MOS element is a p-channel MOS element and in said step of forming the second source/drain region of said p-channel MOS element, said III group dopant are doped in a region of said gate electrode of said p-channel MOS element in a concentration of no higher than $2 \times 10^{20}$ atoms $cm^{-3}$.

5. A method of manufacturing a semiconductor device, comprising the steps of:

(a) forming an element isolation region on a silicon substrate and then forming a gate oxide film for an n-channel MOS element and a p-channel MOS element;

(b) forming gate electrodes and a gate wiring layer electrically interconnecting said gate electrodes, including at least a metal silicide layer;

(c) forming a first source/drain region by forming a first resist mask having a first opening in a first MOS element region and then by doping impurities, which correspond to the polarity of a first MOS element, via said first opening;

(d) forming a second source/drain region, upon removal of said first resist mask, by forming a second resist mask having a second opening in a second MOS element region and then by doping impurities, which correspond to the polarity of a second MOS element, via said second opening; and (e) said second resist mask formed in the step (d) overlapping, at a border region between said first MOS element and said second MOS element, by at least 1 $\mu$m of said first resist mask formed in the step (c).

6. A semiconductor device manufacturing method according to claim 5, wherein said second resist mask formed in the step (d) overlaps by about 4 $\mu$m said first resist mask formed in the step (c).

* * * * *